(12) United States Patent
Hwang et al.

(10) Patent No.: US 9,575,421 B2
(45) Date of Patent: Feb. 21, 2017

(54) APPARATUS FOR PROTECTING EXTREME ULTRA VIOLET MASK AND EXTREME ULTRA VIOLET EXPOSURE APPARATUS INCLUDING THE SAME

(71) Applicant: SAMSUNG ELECTRONICS CO., LTD., Suwon-si, Gyeonggi-do (KR)

(72) Inventors: Myung-soo Hwang, Seoul (KR); Joo-on Park, Seongnam-si (KR); Chang-min Park, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 112 days.

(21) Appl. No.: 14/692,919

(22) Filed: Apr. 22, 2015

(65) Prior Publication Data
US 2016/0070180 A1 Mar. 10, 2016

(30) Foreign Application Priority Data
Sep. 4, 2014 (KR) ........................ 10-2014-0118022

(51) Int. Cl.
| G03F 7/20 | (2006.01) |
| G03F 1/00 | (2012.01) |
| G03F 1/62 | (2012.01) |
| G03F 1/66 | (2012.01) |

(52) U.S. Cl.
CPC ............. *G03F 7/70983* (2013.01); *G03F 1/14* (2013.01); *G03F 1/142* (2013.01); *G03F 1/62* (2013.01); *G03F 1/66* (2013.01); *G03F 7/708* (2013.01); *G03F 7/70733* (2013.01); *G03F 7/70808* (2013.01); *G03F 7/70908* (2013.01)

(58) Field of Classification Search
CPC .. G03F 7/70983; G03F 7/708; G03F 7/70908; G03F 7/70808; G03F 1/14; G03F 1/142; G03F 1/62; G03F 1/66
See application file for complete search history.

(56) References Cited

U.S. PATENT DOCUMENTS

| 6,149,992 A | 11/2000 | Nakayama |
| 6,713,136 B2 | 3/2004 | Tsumoto et al. |

FOREIGN PATENT DOCUMENTS

| JP | 05-121293 A | 5/1993 |
| JP | 2002-258466 A | 9/2002 |
| JP | 2013-004893 A | 1/2013 |
| JP | 2013-033813 A | 2/2013 |
| JP | 2013-165102 A | 8/2013 |
| KR | 10-0147426 B1 | 5/1998 |
| KR | 10-1999-0077357 A | 10/1999 |

(Continued)

*Primary Examiner* — Toan Ton
*Assistant Examiner* — Michelle M Iacoletti
(74) *Attorney, Agent, or Firm* — Lee & Morse P.C.

(57) ABSTRACT

An apparatus for protecting an extreme ultra violet (EUV) mask includes an EUV pellicle that allows EUV light to be radiated through the EUV pellicle onto the EUV mask, the EUV pellicle having a size corresponding to a size of a slit limiting the EUV light to a predetermined portion of the EUV mask, a flexible blocking film at opposite sides of the EUV pellicle in a first direction, the first direction being a scan direction of an exposure apparatus, and a roller unit including a first roller and a second roller, a first portion of the flexible blocking film being wound around the first roller at a first side of the EUV pellicle, and a second portion of the flexible blocking film being wound around the second roller at a second side of the EUV pellicle.

20 Claims, 12 Drawing Sheets

(56) References Cited

FOREIGN PATENT DOCUMENTS

| | | | |
|---|---|---|---|
| KR | 10-2005-0068786 | A | 7/2005 |
| KR | 10-2005-0068967 | A | 7/2005 |
| KR | 10-2005-0112600 | A | 12/2005 |
| KR | 10-2006-0069602 | A | 6/2006 |
| KR | 10-2006-0069607 | A | 6/2006 |
| KR | 10-2010-0024097 | A | 3/2010 |
| KR | 10-2010-0111132 | A | 10/2010 |

APPARATUS FOR PROTECTING EXTREME ULTRA VIOLET MASK AND EXTREME ULTRA VIOLET EXPOSURE APPARATUS INCLUDING THE SAME

CROSS-REFERENCE TO RELATED APPLICATION

Korean Patent Application No. 10-2014-0118022, filed on Sep. 4, 2014, in the Korean Intellectual Property Office, and entitled: "Apparatus for Protecting Extreme Ultra Violet Mask and Extreme Ultra Violet Exposure Apparatus Including the Same," is incorporated by reference herein in its entirety.

BACKGROUND

1. Field

Embodiments relate to an exposure apparatus, and more particularly, to an apparatus for protecting an extreme ultra violet (EUV) mask during an EUV exposure process and an exposure apparatus including the apparatus.

2. Description of the Related Art

Transmission-type exposure systems that use deep ultra violet (DUV) light as a light source have been widely used as exposure apparatuses. As the integration density of semiconductor devices is improved and line widths thereof decrease, next-generation lithography technologies have been studied to improve the resolution of optical lithography. Among them, an exposure apparatus that uses EUV light having a shorter wavelength than that of DUV light has been actively developed and is being applied to semiconductor manufacturing processes.

SUMMARY

Embodiments provide an apparatus for effectively protecting an extreme ultra violet (EUV) mask from a contamination source such as particles during an EUV exposure process.

According to an aspect of embodiments, there is provided an apparatus for protecting an extreme ultra violet (EUV) mask, the apparatus including an EUV pellicle that allows EUV light to be radiated through the EUV pellicle onto the EUV mask, the EUV pellicle having a size corresponding to a size of a slit limiting the EUV light to a predetermined portion of the EUV mask, a flexible blocking film at opposite sides of the EUV pellicle in a first direction, the first direction being a scan direction of an exposure apparatus, and a roller unit including a first roller and a second roller, a first portion of the flexible blocking film being wound around the first roller at a first side of the EUV pellicle, and a second portion of the flexible blocking film being wound around the second roller at a second side of the EUV pellicle.

The EUV pellicle may be movable in the first direction while being synchronized with a scan position of the exposure apparatus, the EUV pellicle being movable via unwinding and winding of the first and second rollers.

The EUV pellicle may have a size that is greater than that of a horizontal section of EUV light input through the slit.

A length of the EUV pellicle in a second direction that is perpendicular to the first direction may be equal to or greater than that of the EUV mask in the second direction.

A length of the EUV pellicle in a second direction that is perpendicular to the first direction may be smaller than that of the EUV mask in the second direction, the blocking film being at opposite sides of the EUV pellicle in the second direction.

The length of the EUV pellicle in the second direction may correspond to a length of an effective pattern region of the EUV mask in the second direction.

The EUV pellicle may include a material and a thickness having transmittance of about 85% or more with respect to the EUV light.

The EUV pellicle may include silicon and has a thickness of about 80 nm or less, and the blocking film has a thickness of about 100 nm or more.

The apparatus may further include a side cover surrounding opposite sides of the EUV pellicle and opposite sides of the blocking film in a second direction that is perpendicular to the first direction.

The side cover may include a body and a fence extending from an upper surface of the body in an upper direction, and a line-shaped groove in a side of the body in the first direction, the EUV pellicle and the blocking film being inserted in the groove.

The apparatus may further include a gas passage for gas flow in the body, the gas passage including an upper passage in an upper portion of the body, the upper passage having an outlet at an upper side of the groove, and a lower passage in a lower portion of the body, the lower passage having an inlet at a lower side of the groove, wherein a portion of gas input to the upper passage flows to the lower passage via the outlet, sides of the EUV pellicle and blocking film inserted in the groove, and the inlet, and a remaining portion of the gas flows to lower sides of the EUV pellicle and blocking film via the outlet and the sides of the EUV pellicle and blocking film.

According to another aspect of embodiments, there is also provided an extreme ultra violet (EUV) exposure apparatus, including an EUV light source, an EUV mask having a pattern to be transferred onto a wafer, an optical system that transmits EUV light generated from the EUV light source to the EUV mask, and transmits the EUV light reflected from the EUV mask to the wafer, a slit unit under the EUV mask, the slit unit having a slit that limits the EUV light to a predetermined portion of the EUV mask, an EUV mask protection apparatus including an EUV pellicle between the EUV mask and the slit unit to transmit the EUV light, the EUV pellicle having a size corresponding to a size of the slit, and flexible blocking film at opposite sides of the EUV pellicle in a first direction that is a scan direction of the EUV exposure apparatus, and a wafer stage supporting the wafer.

The EUV mask protection apparatus may further include a roller unit including a first roller and a second roller, a first portion of the flexible blocking film being wound around the first roller at a first side of the EUV pellicle, and a second portion of the flexible blocking film being wound around the second roller at a second side of the EUV pellicle.

The EUV pellicle may be movable in the first direction while being synchronized with a scan position of the exposure apparatus, the EUV pellicle being movable via unwinding and winding of the first and second rollers.

The EUV mask protection apparatus may further include a side cover surrounding opposite sides of the EUV pellicle and opposite sides of the blocking film in a second direction that is perpendicular to the first direction.

A width of the EUV pellicle along the first direction may equal a maximal width of the slit along the first direction.

According to yet another aspect of embodiments, there is also provided an apparatus for protecting an extreme ultra violet (EUV) mask, the apparatus including an EUV pellicle having a width smaller than a width of the EUV mask, a flexible blocking film connected to opposite sides of the EUV pellicle in a first direction, the first direction being a scan direction of an exposure apparatus, and a roller unit including a first roller and a second roller, a first portion of the flexible blocking film being wound around the first roller at a first side of the EUV pellicle, and a second portion of the flexible blocking film being wound around the second roller at a second side of the EUV pellicle.

A sum of the width of the EUV and widths of the flexible blocking film in the first direction may equal the width of the EUV mask in the first direction.

The EUV pellicle may be stretched between two portions of the flexible blocking film along the first direction, the EUV light being transmitted only through the EUV pellicle at about 85% or more.

A thickness of the EUV pellicle along a direction normal to the EUV mask may be smaller than a thickness of the flexible blocking film along a direction normal to the EUV mask.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
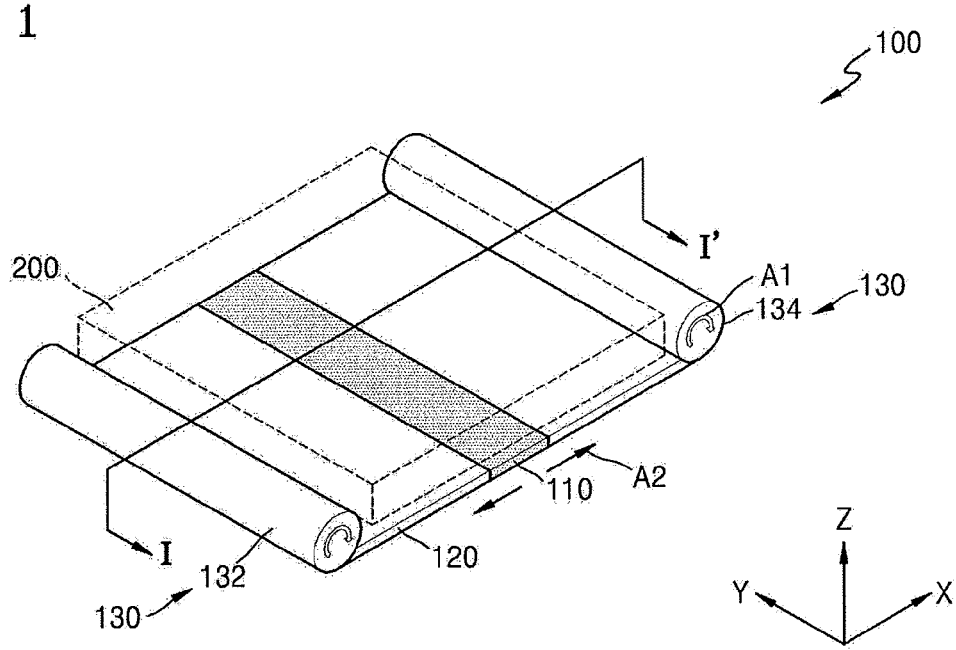
FIG. 1 illustrates a perspective view of an extreme ultra violet (EUV) mask protection apparatus according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers, elements, and regions may be exaggerated for clarity of illustration. It will also be understood that when a layer or element is referred to as being "on" another element or substrate, it can be directly on the other element or substrate, or intervening elements may also be present. In addition, it will also be understood that when a layer is referred to as being "between" two elements, it can be the only element between the two elements, or one or more intervening elements may also be present. Similarly, it will also be understood that when an element is referred to as being "connected to" another element, it can be directly connected to the other element, or intervening elements may also be present. Like reference numerals refer to like elements throughout. The terms used herein are for illustrative purpose only and should not be construed to limit the meaning or the scope of the embodiments as described in the claims.

FIG. 1 is a perspective view of an apparatus 100 for protecting an extreme ultra violet (EUV) mask according to an embodiment.

Referring to FIG. 1, the apparatus 100 for protecting an EUV mask (hereinafter, referred to as "EUV mask protection apparatus") may include an EUV pellicle 110, a blocking film 120, and a roller 130.

The EUV pellicle 110 may be formed of a material that is transparent to exposure light, e.g., EUV light. In the EUV mask protection apparatus 100, the EUV pellicle 110 may be formed of silicon (Si) having a relatively low absorption rate for EUV light, e.g., polysilicon. The EUV pellicle 110 may be formed to have a very small thickness, e.g., a thickness of about 80 nm or less along the Z direction. However, the material of the EUV pellicle 100 is not limited to Si, and the thickness of the EUV pellicle 100 is not limited to the numerical value stated above. The thickness and transmittance of the EUV pellicle 110 will be described below in more detail with reference to FIG. 4.

The EUV pellicle 110 may have a size corresponding to a portion of an EUV mask 200 indicated by a dashed line in FIG. 1. That is, in the EUV mask protection apparatus 100, the EUV pellicle 110 may have a size corresponding to the size of a slit (refer to 'S' of FIG. 11) of an exposure apparatus.

In detail, in an EUV exposure apparatus, a slit, e.g., with a circular arc-shaped curve structure, may be formed to limit the EUV light therethrough to a predetermined portion of the EUV mask 200. Therefore, the EUV pellicle 110 may have a size that, e.g., completely, covers the slit, e.g., having the circular arc-shaped curve structure. For example, a width of the EUV pellicle 110 along the X direction may be sufficient to overlap the slit in order to completely cover the slit, e.g., a width of the EUV pellicle 110 along the X direction may equal and completely overlap the width of the slit along the X direction. For example, a width of the EUV pellicle along the first direction may equal a maximal width of a slit having a circular arc-shaped curve structure, e.g., the maximal width of a slit having a circular arc-shaped curve structure may be defined as a width along the X direction of a rectangle enclosing the circular arc-shape of the slit. Also, the EUV pellicle 110 is not limited to a rectangular structure illustrated in FIG. 1 and may have a curved structure that correspond to a slit having a curved structure.

Exposure apparatuses may be classified into a scanner and a stepper according to a shooting method. This classification is based on whether the shooting, i.e., exposure, method is a scanning method, which is a continuous shooting method, or a step method which is a step-by-step shooting method. That is, the classification of the exposure apparatuses into the scanner and the stepper may be regarded as classification by continuous shooting capability. An EUV exposure process is performed by using the scanning method, and thus, the EUV exposure apparatus is generally referred to as a scanner. Scanning in the EUV exposure apparatus may be performed by using the slit (refer to 'S' of FIG. 11) that limits EUV light to a portion of an EUV mask. In other words, scanning may be performed while radiating EUV light onto a portion of the EUV mask by limiting EUV light via the slit and also while continuously changing a scan position, e.g., moving the EUV mask in a direction opposite to a scan direction. Thus, the EUV light is continuously radiated onto other, e.g., different, regions of the EUV mask. In some cases, the slit may be moved in the scan direction.

The EUV pellicle 110 may have a small size corresponding to the slit described above, and thus, may not be large enough to cover the entire EUV mask 200, i.e., a size of the EUV pellicle 110 may be smaller than that of the EUV mask 200. The EUV pellicle 110 may be disposed in a slit position, i.e., a scan position, corresponding to a portion of the EUV mask 200 on which the radiation of EUV light is required during scanning. Hereinafter, the slit position and the scan position may mean the same unless distinguished. Also, the EUV pellicle 110 may move in a scan direction while being synchronized with a scan position during scanning. The movement of the EUV pellicle 110 will be described in more detail below with reference to the description of the roller 130.

In a DUV exposure process, contamination of a mask, which occurs due to particles, may be prevented by using a pellicle having substantially a same size as the mask. Such a pellicle may be formed to have a thickness of about several hundred nm. For example, in an ArF exposure process, the pellicle may be formed of fluoride polymer having a thickness of about 830 nm. Such a pellicle that is used in the DUV exposure process is thickly formed and, thus, is relatively sturdy, in addition to its similar size with respect to that of the mask.

However, when the pellicle is too thin, the pellicle may be weakened, and thus, be easily broken even by a relatively small impact. In addition, a thin pellicle is very flexible, and thus, when the thin pellicle is formed in a large size, it may be difficult to maintain a fixed template form thereof. For example, when the thin pellicle is formed in a similar size to that of a mask, it may be difficult to maintain a template form in which the entire pellicle keeps a constant distance from the surface of the mask. Accordingly, a path of exposure light passing through the pellicle may vary for each position of the pellicle, and thus, an error of an exposure process may be caused. While a sturdy support line could be formed in such a thin pellicle, the path of exposure light passing through the pellicle would be changed due to the support line itself. Further, while an air curtain by using gas, e.g., $H_2$ gas, could be formed instead of the pellicle, it would be difficult to effectively prevent contamination of particles having heavy mass.

Therefore, in the EUV mask protection apparatus 100 according to embodiments, the EUV pellicle 110 may be formed in a small size, i.e., substantially smaller than the entire EUV mask 200, to correspond, e.g., only, to a portion of the EUV mask 200 rather than the entire EUV mask 200.

For example, the EUV pellicle 110 may have a size corresponding to the size of the slit of an exposure apparatus. Accordingly, the EUV pellicle 110 may solve a problem occurring due to the flexibility thereof. In addition, since the blocking film 120 that is thick and sturdy is disposed at the sides of the EUV pellicle 110, a problem that the EUV pellicle 110 is broken by collision may be solved.

In detail, referring to FIG. 1, the blocking film 120 may be formed at both sides of the EUV pellicle 110. That is, the blocking film 120 may be formed at both sides of the EUV pellicle 110 in a first direction (X direction) that is the scan direction, e.g., the EUV pellicle 110 may be positioned between two portions of the blocking film 120 along the X direction. The blocking film 120 may be formed to be thicker than the EUV pellicle 110, e.g., along the Z direction. For example, the blocking film 120 may have a thickness of about hundreds of nm to about tens of μm.

The blocking film 120 may be formed of a flexible plastic material that may be wound into the roller 130 disposed at both sides of the blocking film 120. For example, the blocking film 120 may be formed of any one of various plastic films, e.g., olefin copolymer, polyethylene terephthalate, polyethylene naphthalate, polyether sulfone, polyimide, polyarylate, polycarbonate, and polyvinyl alcohol. However, the material of the blocking film 120 is not limited to the materials stated above.

The blocking film 120 may be transparent or opaque with respect to EUV light. Also, the blocking film 120 may be formed of a material that absorbs EUV light. In some cases, the blocking film 120 may have a function of preventing EUV light from being incident on the EUV mask 200. In other words, the blocking film 120 may have a function of limiting EUV light, similar to a slit unit 500 (refer to FIG. 11) that has a slit formed therein. Accordingly, a slit unit may be omitted in an exposure apparatus, and the blocking film 120 may substitute for the function of the slit unit.

The roller 130 may include a first roller 132 and a second roller 134. The first roller 132 may wind and fix a first portion of the blocking film 120 on a first side of the EUV pellicle 110, and the second roller 134 may wind and fix a second portion of the blocking film 120 on a second side of the EUV pellicle 110. The structure of the roller 130 will be described below in more detail with reference to FIGS. 7A and 7B.

The first roller 132 and the second roller 134 may be rotated as indicated by a rotation arrow A1, and thus, the EUV pellicle 110 may be moved in the first direction as indicated by a straight arrow A2. That is, as the first roller 132 and the second roller 132 rotate clockwise, the first portion of the blocking film 120 on the first side of the EUV pellicle 110 may be wound around the first roller 132, the second portion of the blocking film 120 on the second side of the EUV pellicle 110 may be unwound from the second roller 134. Thus, the EUV pellicle 110 may move in a direction (−X direction) that is opposite to the first direction. In addition, by rotating the first roller 132 and the second roller 134 counterclockwise, the EUV pellicle 110 may move in the first direction (X direction). For example, the EUV pellicle 110 may move in the first direction, which is the scan direction, while being synchronized with a scan position through the rotation of the roller 130 in a scanning process, and may return to an original position again through the rotation of the roller 130 in the opposite direction when a scanning for the entire mask is completed. In some cases, the scanning may be alternately performed in the first direction (X direction) and a second direction (Y direction), and in this case, the EUV pellicle 110 may not need to return to an original position.

Figure 2A:
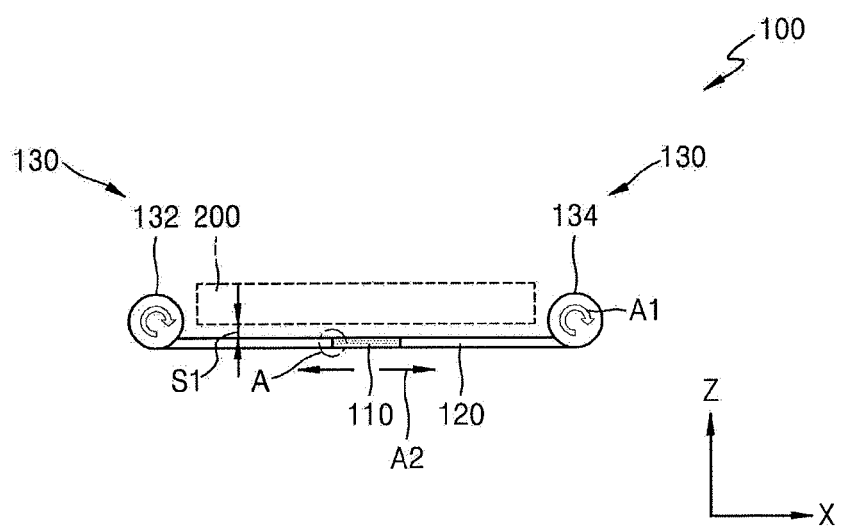
FIG. 2A illustrates a cross-sectional view of the EUV mask protection apparatus of FIG. 1.
Figure 2B:
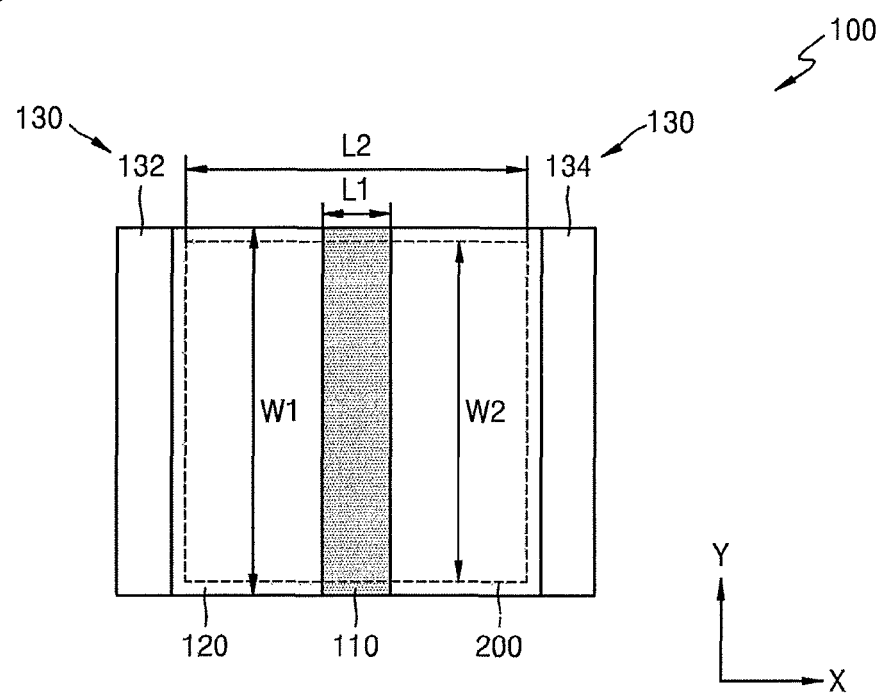
FIG. 2B illustrates a plan view of the EUV mask protection apparatus of FIG. 1.

FIG. 2A is a cross-sectional view of the EUV mask protection apparatus 100 of FIG. 1, and FIG. 2B is a plan view of the EUV mask protection apparatus 100 of FIG. 1. FIG. 2A is a cross-sectional view taken along the line I-I' of FIG. 1.

Referring to FIG. 2A, the EUV mask protection apparatus 100 may include the EUV pellicle 110, the blocking film 120, and the roller 130, and may be disposed under the EUV mask 200. The EUV pellicle 110 may be separated from the EUV mask 200 by a first separation distance S1 along the Z direction. The first separation distance S1 may correspond to a distance that deviates from a focal position in an optical path of EUV light. Accordingly, although particles that are foreign substances exist on the surface of the EUV pellicle 110, the particles may not be transferred to a wafer. The first separation distance S1 may be, e.g., several mm or so.

As illustrated in FIG. 2A, the EUV pellicle 110 may move in the first direction (X direction) or a direction (−X direction) that is opposite to the first direction, according to the rotation of the roller 130. For example, when the first roller 132 and the second roller 134 rotate clockwise, the EUV pellicle 110 may move in the direction (−X direction) that is opposite to the first direction. When the first roller 132 and the second roller 134 rotate counterclockwise, the EUV pellicle 110 may move in the first direction (X direction).

Referring to FIG. 2B, in the EUV mask protection apparatus 100, the EUV pellicle 110 may have a first length L1 in the first direction (X direction) and have a first width W1 in the second direction (Y direction). The first width W1 of the EUV pellicle 110 may be equal to a width of the blocking film 120 in the second direction. The EUV pellicle 110 may be connected to the blocking film 120 disposed at both sides of the EUV pellicle 110 in the first direction and thus may be strongly supported. For example, as the blocking film 120 pulls the EUV pellicle 110 at both sides thereof, a tensile force may be given, e.g., applied, to the EUV pellicle 110. Due to the tensile force at both sides of the EUV pellicle 110, the EUV pellicle 110 may maintain a, e.g., uniformly, tight flat state. Thus, the whole surface of the EUV pellicle 110 may maintain the same distance from the EUV mask 200.

The EUV mask 200 indicated by the dashed line in FIG. 2B may have a second length L2 in the first direction (X direction) and have a second width W2 in the second direction (Y direction). When comparing the size of the EUV pellicle 110 to the size of the EUV mask 200, the first length L1 of the EUV pellicle 110 may be less than the second length L2 of the EUV mask 200. In addition, the first width W1 of the EUV pellicle 110 may be greater than the second width W2 of the EUV mask 200.

A length in the first direction of a horizontal section of EUV light that is input through a slit may be less than the first length L1 of the EUV pellicle 110. A width in the second direction of the horizontal section of the EUV light may be less than the first width W1 of the EUV pellicle 110. Accordingly, all the EUV light that is input through the slit may be radiated onto a required region of the EUV mask 200 without blocking by the EUV pellicle 110.

As illustrated in FIG. 2B, the total size obtained by adding the size of the EUV pellicle 110 and the size of the blocking film 120 may be greater than the size of the EUV mask 200. By enlarging the total size and disposing the EUV pellicle 110 and the blocking film 120 under the EUV mask, particles that are input from a lower side of the EUV mask may be more effectively blocked.

The EUV mask 200 may have, e.g., a size of about 150×150 mm² and a thickness of about 6 mm. Patterns may not be formed in the entire EUV mask 200, but only in a portion of the EUV mask 200. That is, patterns may not be formed around the edge of the EUV mask 200. Accordingly, a portion in which patterns have been formed is referred to as an effective pattern region. A region on which EUV light is radiated through a slit in a scanning process may be an effective pattern region of the EUV mask 200. Accordingly, the width of the slit in the second direction may be less than the second width W2 of the EUV mask 200. For example, the slit may have a length of about 40 mm in the first direction and a width of about 104 mm in the second direction. However, the size of the slit is not limited to the numerical values stated above. The length and width of the EUV pellicle 110 may be greater than the length and width of the slit, respectively.

As the EUV mask protection apparatus 100 includes the EUV pellicle 110 having a size corresponding to the size of the slit that limits EUV light to a portion of the EUV mask 200, the EUV mask protection apparatus 100 may effectively solve a problem that may occur due to the flexibility of the EUV pellicle 110 having a small thickness. In addition, as the blocking film 120 that is thick and sturdy is formed at both sides of the EUV pellicle 110, a problem that the EUV pellicle 110 is broken by collision may also be solved. Furthermore, as the EUV pellicle 110 moves while being synchronized with a scan position in a scan direction through a roller, a scanning process may not be influenced at all.

As a result, the EUV mask protection apparatus 100 may effectively solve problems that may be caused by a thin EUV pellicle covering an entire EUV mask, while effectively protecting the EUV mask 200 from contamination, e.g., particles, during an exposure process, since the EUV mask protection apparatus 100 is implemented in a form optimized for scanning.

FIGS. 3A through 3D are enlarged cross-sectional views of portion A in FIG. 2A. The cross-sections in FIGS. 3A through 3D illustrate various examples for a coupling structure between the EUV pellicle 100 and the blocking film 120.

Figure 3A:
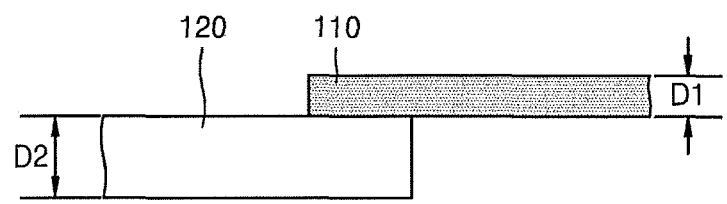
FIGS. 3A through 3D illustrate enlarged cross-sectional views of portion A in FIG. 2A.

For example, referring to FIG. 3A, in the EUV mask protection apparatus 100 according to the present embodiment, the EUV pellicle 110 and the blocking film 120 may be coupled to each other to provide a structure in which a portion of the EUV pellicle 100 is stacked on an upper surface of the blocking film 120. The EUV pellicle 110 and the blocking film 120 may be strongly coupled to each other through an adhesive. In some cases, the EUV pellicle 110 and the blocking film 120 may be coupled to each other through thermal compression.

In detail, the EUV pellicle 110 may have a first thickness D1. For example, the first thickness D1 of the EUV pellicle 110 may be 80 nm or less, e.g., the first thickness D1 of the EUV pellicle 110 may be 70 nm or less.

The blocking film 120 may have a second thickness D2, and the second thickness D2 may be greater than the first thickness D1 of the EUV pellicle 110. For example, the second thickness D2 of the blocking film 120 may be about 100 nm or more. In the EUV mask protection apparatus 100 according to the present embodiment, the second thickness D2 of the blocking film 120 may be hundreds of nm to tens of μm. The blocking film 120 may be formed of a flexible material that may be wound around the roller 130 (FIG. 1).

Figure 3B:
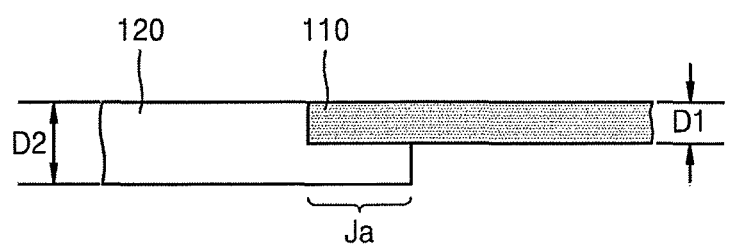

In another example, referring to FIG. 3B, in the EUV mask protection apparatus 100 according to the present embodiment, a coupling structure between the EUV pellicle 110 and the blocking film 120 may be similar to the coupling structure of FIG. 3A in that a portion of the EUV pellicle 110 is stacked on an upper surface of the blocking film 120. However, in the EUV mask protection apparatus 100 according to the current embodiment, a coupling portion Ja having a predetermined depth may be formed in an edge portion of the blocking film 120, and the EUV pellicle 110 and the blocking film 120 may be coupled to each other to provide a structure in which a portion of the EUV pellicle 110 is stacked on the coupling portion Ja.

As illustrated in FIG. 3B, the predetermined depth of the coupling portion Ja of the blocking film 120 may be equal to the first depth D1 of the EUV pellicle 110. For example, an upper surface of the blocking film 120 and an upper surface of the EUV pellicle 110 may form the same plane, e.g., may be level with each other. In another example, the predetermined depth of the coupling portion Ja of the blocking film 120 may not be equal to the first depth D1 of the EUV pellicle 110. The EUV pellicle 110 and the blocking film 120 may be coupled to each other through an adhesive or through thermal compression.

Figure 3C:
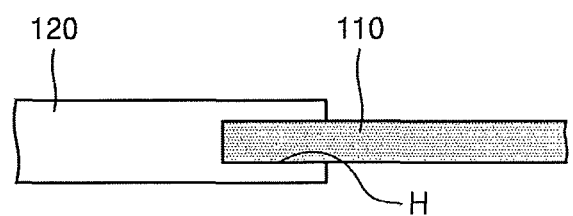

In yet another example, referring to FIG. 3C, in the EUV mask protection apparatus 100 according to the present embodiment, the EUV pellicle 110 and the blocking film 120 may be coupled to each other to provide a structure in which a portion of the EUV pellicle 110 is inserted into a groove H formed at the side of the blocking film 120. In this case, as the EUV pellicle 110 and the blocking film 120 are coupled to each other through respective three surfaces, the EUV pellicle 110 and the blocking film 120 may be strongly coupled to each other. The EUV pellicle 110 and the blocking film 120 may be coupled to each other through an adhesive or through thermal compression.

Figure 3D:
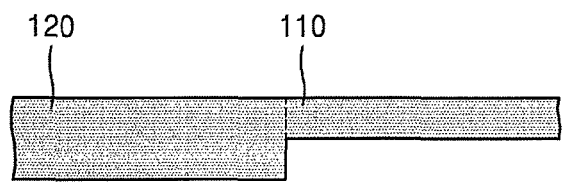

In still another example, referring to FIG. 3D, in the EUV mask protection apparatus 100 according to the present embodiment, the EUV pellicle 110 may be integrated with the blocking film 120 by using the same material, unlike the coupling structures of FIGS. 3A through 3C. For example, both the EUV pellicle 110 and the blocking film 120 may be formed of Si. However, as illustrated in FIG. 3D, the blocking film 120 may be thicker than the EUV pellicle 110.

An integrated structure in which the EUV pellicle 110 and the blocking film 120 are integrated into a single, e.g., seamless, structure, as illustrated in FIG. 3D, may be implemented through an etch process for Si. For example, after forming a resist pattern exposing only a portion corresponding to the EUV pellicle 110, the integral structure may be implemented by removing an exposed S1 portion through an etch process.

The integrated structure in which the EUV pellicle 110 and the blocking film 120 are integrated may be formed through a deposition process or a stack process. For example, after initially forming an original plate having a very small thickness, the blocking film 120 may be formed by forming a material layer on a portion of the original plate, which corresponds to the blocking film 120, through a deposition process or stacking a material layer on the portion of the original plate through an adhesive. In the case of forming the blocking film 120 by using a deposition process or a stack process, a portion of the blocking film 120 may be formed of a material layer that is different from that of the EUV pellicle 110.

Although several types of coupling structures in which the EUV pellicle 110 and the blocking film 120 are coupled to each other have been illustrated, embodiments are not limited thereto. For example, all coupling structures, implemented in a plate form by coupling an EUV pellicle having a relatively small size and a relatively small thickness to a blocking film having a relatively large size and a relatively large thickness to protect an EUV mask, are included in the embodiments.

Figure 4:
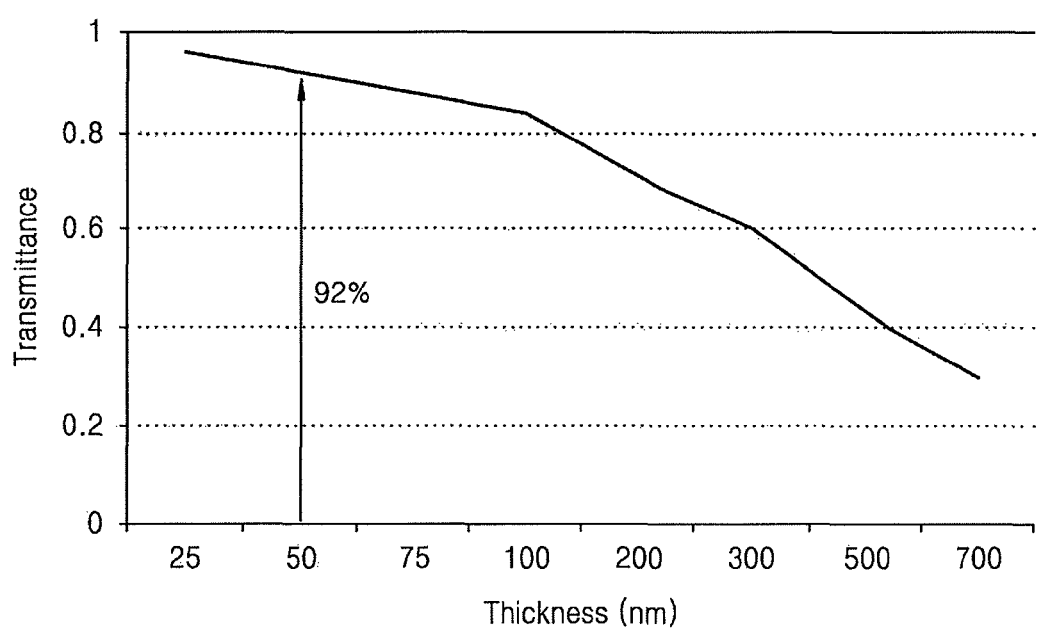
FIG. 4 illustrates a graph showing transmittance of EUV light according to a thickness of a Si film.

FIG. 4 is a graph showing the transmittance of EUV according to the thickness of a Si film. The X axis of the graph denotes the thickness of the Si film, and the unit of the thickness is nm. The Y axis of the graph denotes the transmittance of EUV.

Referring to FIG. 4, the transmittance of EUV decreases as the thickness of the Si film increases. For example, when the thickness of the Si film is 300 nm, the transmittance of EUV may be 0.5 or less. In general, the transmittance of EUV has to be 0.85 or more to use the Si film as a pellicle for mask protection. When considering that exposure light passes through a pellicle two times when the transmittance of the pellicle is about 0.85, light that is reflected from a mask and then penetrates the pellicle may be only about 70% of light initially incident on the pellicle.

When the thickness of the Si film is about 50 nm, the transmittance of EUV may be about 0.92. When the transmittance of EUV is about 0.92, EUV light may pass through the Si film two times and thus about 85% of initially incident EUV may be output. Based on transmittance of 0.85 or more, the thickness of the Si film has to be a maximum of about 70 nm to about 80 nm to implement an EUV pellicle by using the Si film. Accordingly, when a pellicle is formed to have a large thickness, a great portion of EUV is absorbed in the pellicle, and thus, a function of the pellicle may be lost. The material of the EUV pellicle is not limited to the Si film. For example, the EUV pellicle may be formed of a material having transmittance that is similar to or higher than that of the Si film with respect to EUV.

Figure 5A:
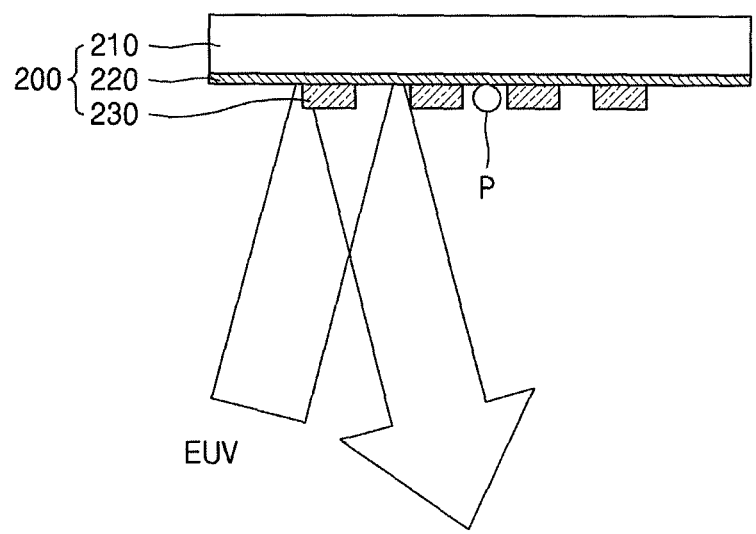
FIGS. 5(a) and 5(b) illustrate cross-sectional views showing a function of a pellicle in an EUV mask protection apparatus according to an embodiment.
Figure 5B:
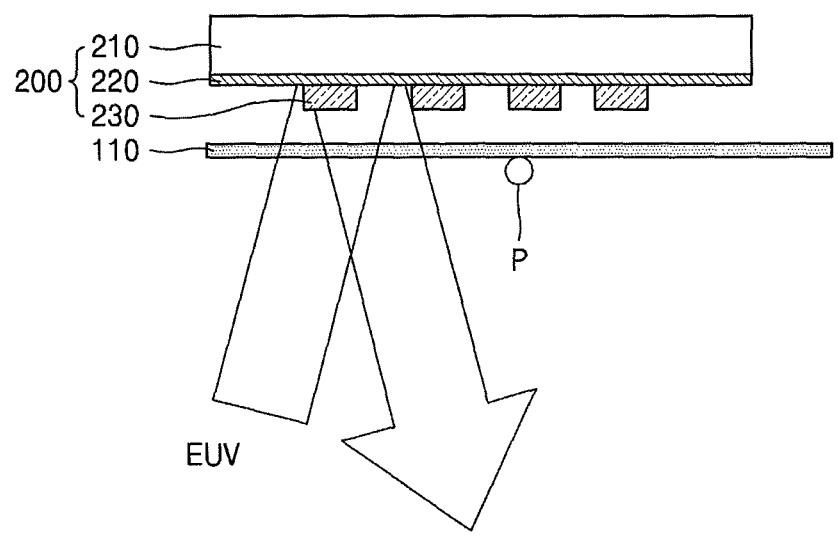

FIGS. 5A and 5B are cross-sectional views showing a function of a pellicle in an EUV mask protection apparatus according to an embodiment. FIG. 5A illustrates a cross-sectional view before the EUV pellicle 110 is disposed, and FIG. 5B illustrates a cross-sectional view after the EUV pellicle 110 is disposed.

Referring to FIGS. 5A and 5B, an EUV mask 200 may include a reticle substrate 210, a reflective layer 220, and an absorption layer pattern 230. The reticle substrate 210 may be a glass or quartz substrate. The reflective layer 220 may be formed on the reticle substrate 210 and may reflect light incident on the reflective layer 220. That is, as illustrated in FIGS. 5A and 5B, the absorption layer pattern 230 may be formed on the reflective layer 220, and the reflective layer 220 may be exposed between patterns of the absorption layer pattern 230.

The reflective layer 220 may be formed to have a multi-layer structure in which Mo/Si layers are repeatedly stacked to form 30 to 60 layers. Although not illustrated in FIGS. 5A and 5B, a capping layer may be formed on an upper surface of the reflective layer 220 to protect the reflective layer 220. The capping layer may be formed of, e.g., ruthenium oxide (RuO) or the like. In some cases, the capping layer may be omitted.

The absorption layer pattern 230 may be formed of an inorganic material or a metal. The absorption layer pattern 230 may be mainly formed of a tantalum (Ta)-based compound. For example, the absorption layer pattern 230 may be formed of TaN, TaBN, TaBON, or the like. However, embodiments are not limited thereto, e.g., the absorption layer pattern 230 may be formed of an inorganic material, which is opaque with respect to light, or a metal, e.g., chromium (Cr), chromium oxide (CrO), nickel (Ni), copper (Cu), molybdenum (Mo), aluminum (Al), titanium (Ti), uranium (W) or ruthenium (Ru). Although not illustrated in FIGS. 5A and 5B, an anti-reflection coating (ARC) layer may be formed on the absorption layer pattern 230. In some cases, the ARC layer may be omitted.

As illustrated in FIG. 5A, when a particle P exists on the EUV mask 200, EUV may be scattered or the intensity of reflective light may be lowered due to the particle P. Thus, an error may be induced in an exposure process. For example, due to the existence of the particle P, a pattern of the EUV mask 200 may not be correctly transferred into a wafer, e.g., a distorted pattern may be transferred into the wafer, thereby causing formation of a pattern having a shape that is different from that of the pattern of the EUV mask 200 on the wafer. When the particle P exists on the reflective layer 220 between patterns of the absorption layer pattern 230, errors may increase.

When the particle P exists on the absorption layer pattern 230, an exposure process may not be influenced since the absorption layer pattern 230 does not reflect light. However, when the particle P exists at an edge portion of the absorption layer pattern 230, scattering may occur due to the particle P to thereby influence the reflective layer 220. Accordingly, a contamination factor, e.g., the particle P, has to be prevented from flowing onto any parts of the EUV mask 200 to ensure a stable and correct exposure process.

Accordingly, as shown in FIG. 5B, the EUV pellicle 110 may be disposed under the EUV mask 200. The EUV pellicle 110 may be, e.g., the EUV pellicle 110 illustrated in FIGS. 1 through 2B. For example, the EUV pellicle 110 of FIG. 5B may correspond to a cross section obtained by cutting, in the second direction (Y direction), a portion of the EUV pellicle 110 in the EUV mask protection apparatus 100 of FIG. 1. As the EUV pellicle 110 is disposed as illustrated in FIG. 5B, a particle P that is input from a lower side of the EUV pellicle 110 may be blocked by the EUV pellicle 110. In addition, a blocking film (not shown) disposed at both sides of the EUV pellicle 110 may also block a particle P that is input from a lower side of the EUV pellicle 110. Accordingly, errors, which may occur due to the contamination of the EUV mask 200, may decrease in an exposure process, and thus, a stable exposure process may be performed.

Figure 6A:
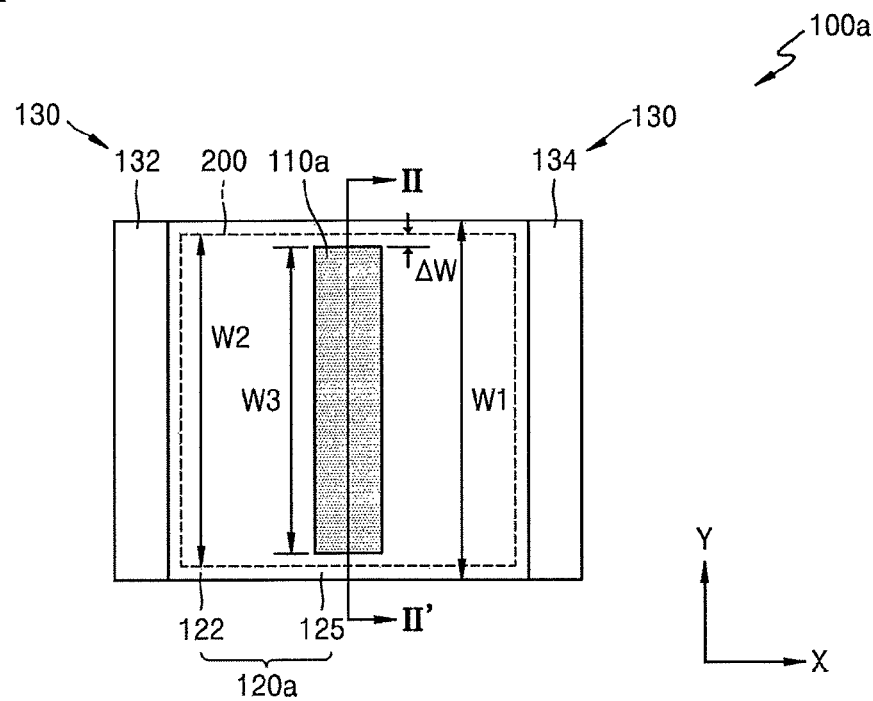
FIG. 6A illustrates a plan view of an EUV mask protection apparatus according to another embodiment.
Figure 6B:
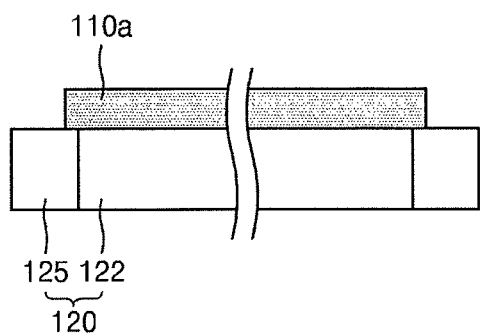
FIG. 6B illustrates a cross-sectional view of the EUV mask protection apparatus of FIG. 6A.

FIG. 6A is a plan view of an EUV mask protection apparatus 100a according to another embodiment, and FIG. 6B is a cross-sectional view of the EUV mask protection apparatus 100a. FIG. 6B is a cross-sectional view taken along the line of FIG. 6A. For convenience of explanation, descriptions provided above with reference to FIGS. 1 through 2B will be briefly stated or omitted.

Referring to FIGS. 6A and 6B, the EUV mask protection apparatus 100a is similar to the EUV mask protection apparatus 100 of FIG. 1. However, the size and disposition of an EUV pellicle 110a of the EUV mask protection apparatus 100a may be different from those of the EUV pellicle 110 of the EUV mask protection apparatus 100 of FIG. 1. In detail, the EUV pellicle 110a may have a third width W3 in the second direction (Y direction). The third width W3 of the EUV pellicle 110a may be less than a first width W1 of a blocking film 120a. Also, the third width W3 of the EUV pellicle 110a may be less than a second width W2 of an EUV mask 200.

As described above, the EUV mask 200 may include an effective pattern region, in which a pattern has been formed, and an edge region around the effective pattern region. In the EUV mask protection apparatus 100a, the third width W3 of the EUV pellicle 110a may correspond to the width of the effective pattern region of the EUV mask 200 in the second direction. For example, the third width W3 of the EUV pellicle 110a may be equal to or greater than the width of the effective pattern region in the second direction. When the third width W3 of the EUV pellicle 110a is equal to the width of the effective pattern region in the second direction, a portion corresponding to a width ΔW may be the edge region of the EUV mask 200.

As the third width W3 of the EUV pellicle 110a is less than the first width W1 of the blocking film 120a, the blocking film 120a may be formed at both sides of the EUV pellicle 110a in the second direction. Accordingly, the blocking film 120a may include a first blocking film 122 disposed at both sides of the EUV pellicle 110a in the first direction, and a second blocking film 125 disposed at both sides of the EUV pellicle 110a in the second direction. The second blocking film 125 may be connected to the first blocking film 122, disposed at the both sides of the EUV pellicle 110a in the first direction, to form an integral structure of the blocking film 120a.

Although a coupling structure in which the EUV pellicle 110a is stacked on an upper surface of the blocking film 120a is illustrated in FIG. 6B, embodiments are not limited thereto. For example, the EUV pellicle 110a and the blocking film 120a may be coupled to each other to form a coupling structure that is the same as any one of the coupling structures of FIGS. 3A through 3D. Also, the EUV pellicle 110a and the blocking film 120a may be coupled to each other to form a coupling structure that is different from the coupling structures of FIGS. 3A through 3D.

For example, in the EUV mask protection apparatus 100a, the EUV pellicle 110a may be disposed in the inside of the blocking film 120a, e.g., the blocking film 120a may surround a bottom and four side surfaces of the EUV pellicle 110a. In this case, the EUV pellicle 110a may be formed to have a small size. In addition, the EUV pellicle 110a may be supported by four sides and thus may more strongly maintain a flat state. Accordingly, the EUV pellicle 110a may maintain the same distance from the EUV mask 200 all over the surface of the EUV pellicle 110a.

Figure 7A:
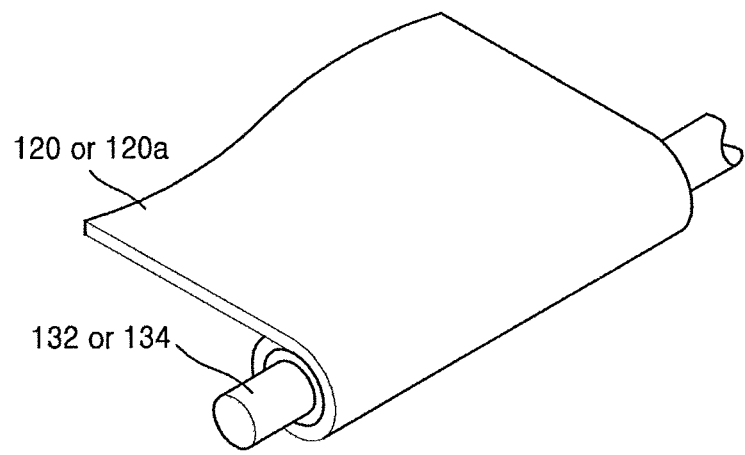
FIGS. 7A and 7B illustrate detailed perspective views of a roller portion in the EUV mask protection apparatus of FIG. 1 or FIG. 6A.
Figure 7B:
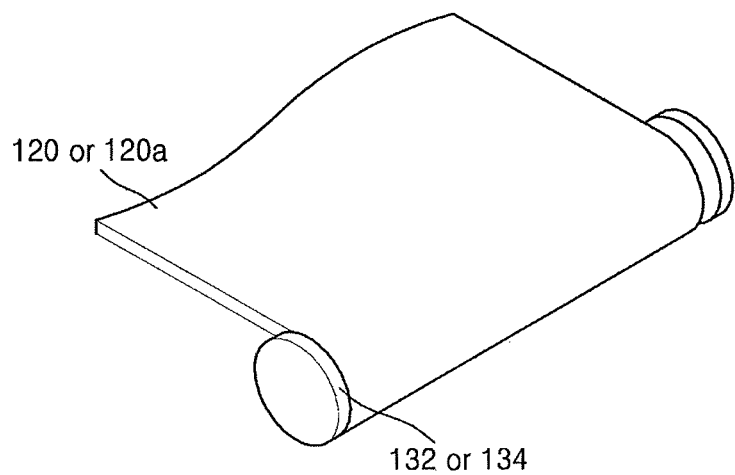

FIGS. 7A and 7B are perspective views showing in more detail examples of the roller portion 130 in the EUV mask protection apparatus 100 or 100a of FIG. 1 or FIG. 6A.

For example, referring to FIG. 7A, the first roller 132 or the second roller 134 may have a form that is similar to that of an elongated cylindrical rod. The blocking film 120 or 120a may be wound around the first roller 132 or the second roller 134, and may be supported by the first roller 132 or the second roller 134. The first roller 132 and the second roller 134 may be connected to and rotated by a driving apparatus. When the first roller 132 and the second roller 134 rotate, the blocking films 120 and 120a move in the first direction to thereby move the EUV pellicle 110, as described above.

In another example, referring to FIG. 7B, the first roller 132 or the second roller 134 may have a structure that is similar to that of a dumbbell. The blocking film 120 or 120a may be wound around the first roller 132 or the second roller 134, which has a dumbbell structure, and may be supported by the first roller 132 or the second roller 134. The blocking film 120 or 120a may be wound between two weights of the dumbbell structure. The first roller 132 and the second roller 134, which have the dumbbell structure, may be connected to and rotated by a driving apparatus. When the first roller 132 and the second roller 134 rotate, the EUV pellicle 110 may move in the first direction.

Figure 8A:
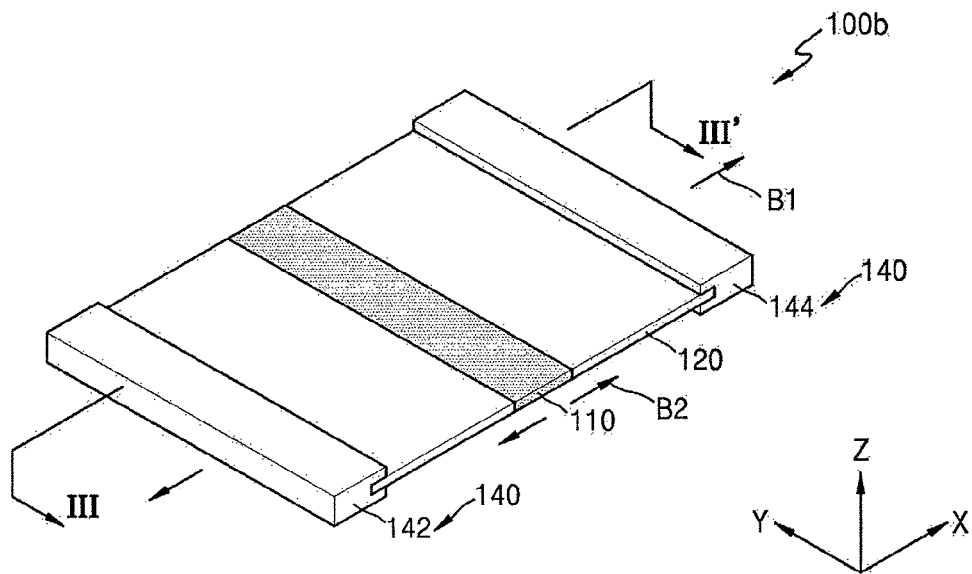
FIG. 8A illustrates a perspective view of an EUV mask protection apparatus according to another embodiment.
Figure 8B:
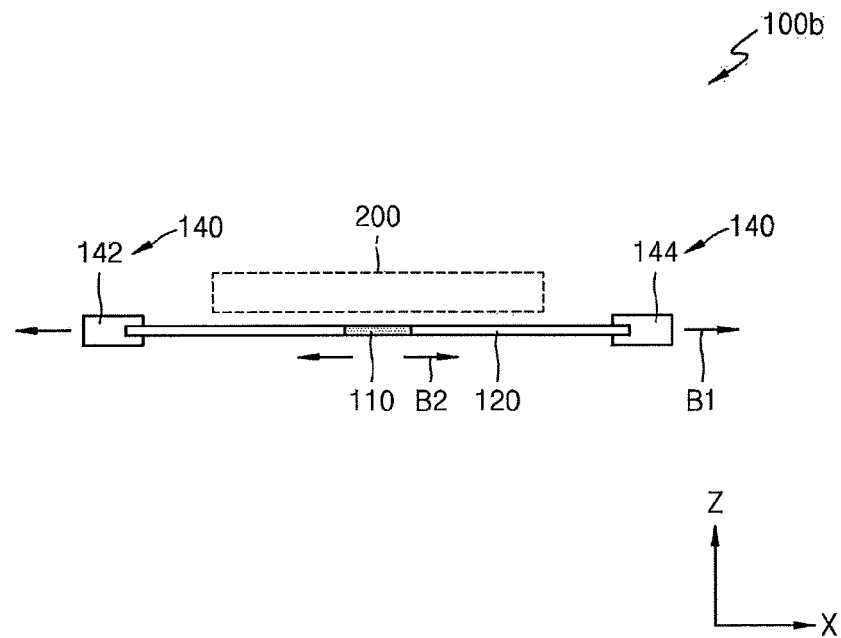
FIG. 8B illustrates a cross-sectional view of the EUV mask protection apparatus of FIG. 8A.

FIG. 8A is a perspective view of an EUV mask protection apparatus 100b according to another embodiment, and FIG. 8B is a cross-sectional view of the EUV mask protection apparatus 100b. FIG. 8B is a cross-sectional view taken along the line of FIG. 8A. For convenience of explanation, descriptions provided above with reference to FIGS. 1 through 2B will be briefly stated or omitted.

Referring to FIGS. 8A and 8B, the EUV mask protection apparatus 100b may include the EUV pellicle 110, the blocking film 120, and a supporter 140. The EUV pellicle 110 and the blocking film 120 are the same as those described with reference to FIG. 1. For example, the EUV pellicle 110 may have a size corresponding to a slit of an exposure apparatus and may be formed to have a very small thickness, e.g., a thickness of about 80 nm or less. The blocking film 120 may be formed at both sides of the EUV pellicle 110 in the first direction (X direction) and may have a large thickness, e.g., a thickness of hundreds of nm or more.

The supporter 140 may include a first supporter 142 and a second supporter 144. The first supporter 142 may fix the first portion of the blocking film 120 on the first side of the EUV pellicle 110, and the second supporter 144 may fix the second portion of the blocking film 120 on the second side of the EUV pellicle 110. Unlike the first roller 132 and the second roller134 of FIG. 1, the blocking film 120 may be put in a groove of the side of the first supporter 142 and a groove of the side of the second supporter 144 and, thus, may be fixed.

The blocking film 120 may be coupled to the groove of the first supporter 142 and the groove of the second supporter 144 through an adhesive or a mechanical coupling. Examples of the mechanical coupling may include various couplings that may strongly couple the blocking film 120 to the supporter 140, e.g., an insertion coupling or a wedge coupling.

Also in the EUV mask protection apparatus 100b, the EUV pellicle 110 may move in a scan direction while being synchronized with a scan position during scanning. The first supporter 142 and the second supporter 144 may be connected to a horizontal movement driving apparatus to move the EUV pellicle 110. The first supporter 142 and the second supporter 144 may move in the first direction (X direction) by the horizontal movement driving apparatus as indicated by the arrow B1, and thus, the EUV pellicle 110 may also move in the first direction (X direction) as indicated by the arrow B2.

More specifically, the first supporter 142 and the second supporter 144 may move in the first direction (X direction) by the horizontal movement driving apparatus, and thus, the EUV pellicle 110 may also move in the first direction (X direction). On the contrary, the first supporter 142 and the second supporter 144 may move in a direction (−X direction), that is opposite to the first direction (X direction), by the horizontal movement driving apparatus, and thus, the EUV pellicle 110 may also move in the direction (−X direction).

While positions (positions in the first direction) of the first and second rollers 132 and 134 of the EUV mask protection apparatus 100 of FIG. 1 are not changed, the supporters 142 and 144 of the EUV mask protection apparatus 100b according to the current embodiment move in the first direction. Due to this difference, when the EUV pellicle 110 moves to an edge portion of the EUV mask 200 in the first direction, the opposite edge portion of the EUV mask 200 in the first direction must not be exposed by the blocking film 120 downward, e.g., the blocking film 120 is sufficiently long to continue blocking the entire EUV mask 200 in either direction during the entire exposure process. Accordingly, a length (a length in the first direction) of each of two blocking films 120 disposed at both sides of the EUV pellicle 110 may be greater than that of each of two blocking films 120 disposed at both sides of the EUV pellicle 110 of the EUV mask protection apparatus 100 illustrated in FIG. 1.

For example, if it is assumed that in the EUV mask protection apparatus 100 illustrated in FIG. 1, a length of each of two blocking films 120 disposed at both sides of the EUV pellicle 110 is L3 when the EUV pellicle 110 is in the central portion the EUV mask protection apparatus 100 in the first direction, the EUV pellicle 110 of the EUV mask protection apparatus 100b according to the current embodiment is fixedly positioned in the central portion of the EUV mask protection apparatus 100b in the first direction and each of two blocking films 120 disposed at both sides of the EUV pellicle 110 of the EUV mask protection apparatus 100b may have a length of 2*L3 in the first direction. When the EUV mask 200 moves, the EUV mask protection apparatus 100b may be fixed without moving.

Figure 9A:
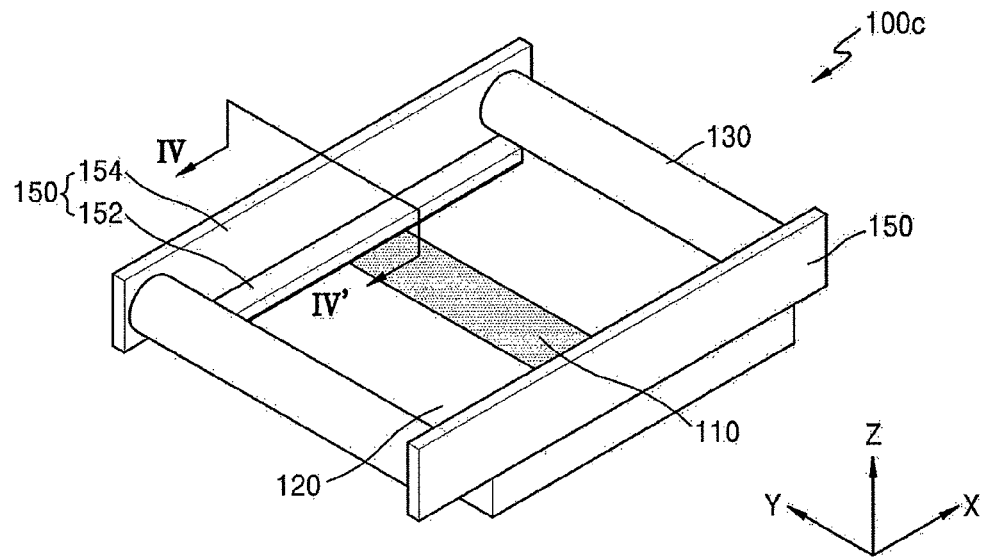
FIGS. 9A and 9B illustrate perspective views of an EUV mask protection apparatus according to another embodiment.
Figure 9B:
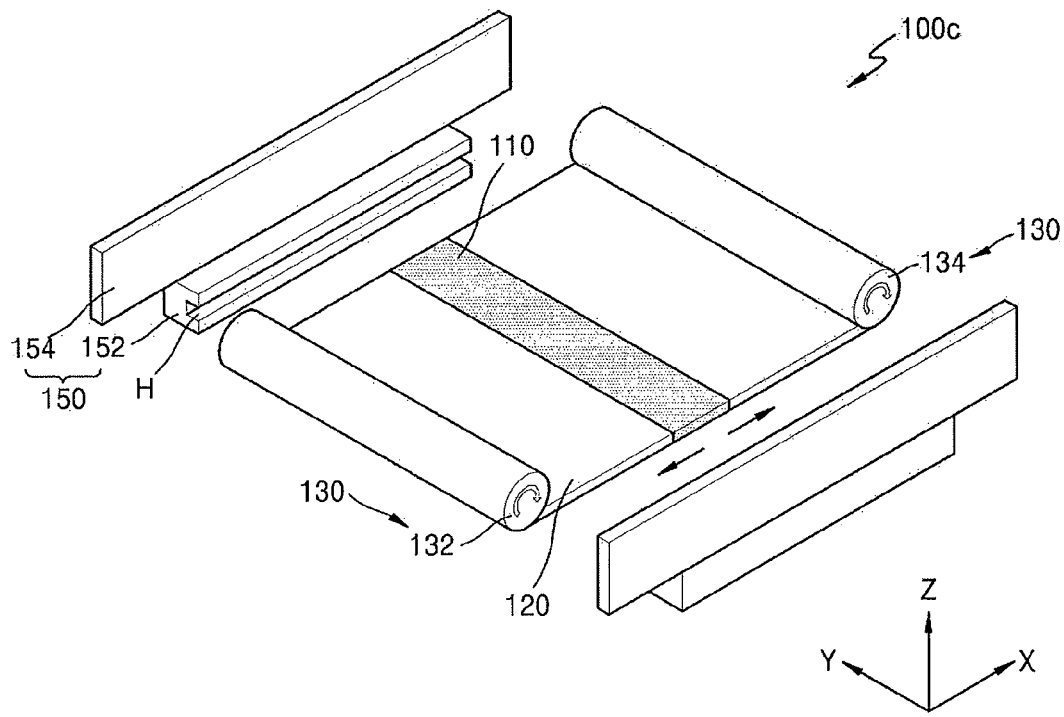
Figure 9C:
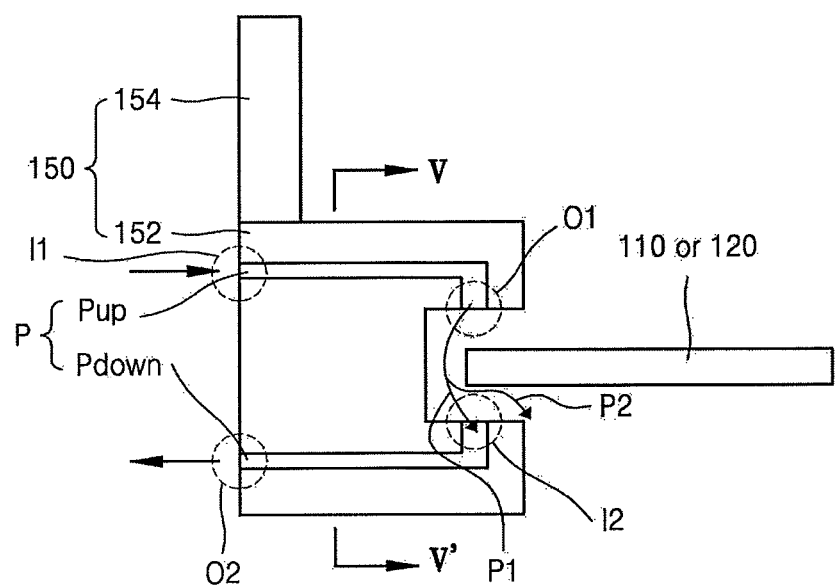
FIG. 9C illustrates a cross-sectional view of the EUV mask protection apparatus of FIG. 9A.

FIGS. 9A and 9B are perspective views of an EUV mask protection apparatus 100c according to another embodiment, and FIG. 9C is a cross-sectional view of the EUV mask protection apparatus 100c. FIG. 9B is an exploded perspective view of FIG. 9A, and FIG. 9C is a cross-sectional view taken along the line IV-IV' of FIG. 9A. For convenience of explanation, descriptions provided above with reference to FIGS. 1 through 2B will be briefly stated or omitted.

Referring to FIGS. 9A and 9B, the EUV mask protection apparatus 100c may include the EUV pellicle 110, the blocking film 120, the roller 130, and a side cover 150. The EUV pellicle 110, the blocking film 120, and the roller 130 are the same as those of the EUV mask protection apparatus 100 of FIG. 1. The side cover 150 may be disposed to surround a side of the EUV pellicle 110 and a side of the blocking film 120.

In detail, the side cover 150 may include a body 152 and a fence 154. The body 152 may have a long form in the first direction, and a vertical cross-section of the body 152 may have a quadrangular form (refer to FIG. 9C). However, the vertical cross-section of the body 152 is not limited to a quadrangular form. A line-shaped groove H may be formed in the first direction (X direction) in the side of the body 152, and the EUV pellicle 110 and the blocking film 120 may be inserted into the line-shaped groove H.

The fence 154 may extend from an upper surface of the body 152 in the Z direction to have a predetermined height. For example, the fence 154 may have a height corresponding to the thickness of the EUV mask 200. Also, the fence 154 may have a structure in which the fence 154 extends in the first direction to correspond to a structure of the body 152 which extends in the first direction. The fence 154 may block particles that may flow onto the side of the EUV mask 200 during an exposure process.

The length of the fence 154 in the first direction may be greater than that of the body 152 in the first direction. For example, the length of the body 152 in the first direction may correspond to the sum of the length of the EUV pellicle 110 in the first direction and the length of the blocking film 120 in the first direction. On the other hand, the length of the fence 154 in the first length may correspond to a length obtained by adding diameters of both rollers 132 and 134 to the sum of the length of the EUV pellicle 110 in the first direction and the length of the blocking film 120 in the first direction. Accordingly, as illustrated in FIG. 9B, the fence 154 may have a structure in which the fence 154 extends more than the body 152 in the first direction. The fence 154 that extends more than the body 152 in the first direction may cover the first and second rollers 132 and the 134.

Referring to FIG. 9C, a gas passage P may be formed in the body 152. The gas passage P may include an upper passage Pup and a lower passage Pdown. The upper passage Pup may be formed in an upper portion of the body 152, with an inlet I1 of the upper passage Pup being formed at the outer side of the body 152, and an outlet O1 of the upper passage Pup being formed at the upper side of the groove H. The lower passage Pdown may be formed in a lower portion of the body 152, with an inlet I2 of the lower passage Pdown being formed at the lower side of the groove H, and an outlet O2 of the lower passage Pdown being formed at the outer side of the body 152. In some cases, the inlet I1 of the upper passage Pup and the outlet O2 of the lower passage Pdown may not be formed at the outer side of the body 152, but may be formed at both end sides of the body 152 in the first direction.

For example, a gas (e.g., $H_2$ gas) may flow through two paths. A first path P1 may be a path in which the gas flows through the inlet I1 of the upper passage Pup, the upper passage Pup, the outlet O1 of the upper passage Pup, the side of the EUV pellicle 110 or blocking film 120 in the groove H, the inlet I2 of the lower passage Pdown, the lower passage Pdown, and the outlet O2 of the lower passage Pdown. A second path P2 may be a path in which the gas flows through the inlet I1 of the upper passage Pup, the upper passage Pup, the outlet O1 of the upper passage Pup O1, the side of the EUV pellicle 110 or blocking film 120 in the groove H, and the lower side of the EUV pellicle 110 or blocking film 120.

Gas input to the inlet I1 of the upper passage Pup may flow through both the first path P1 and the second path P2. For example, a portion of the gas input to the inlet I1 of the upper passage Pup may flows through the first path P1, and a remaining portion of the gas may flow through the second path P2. Accordingly, the amount of gas that is discharged through the outlet O2 of the lower passage Pdown may be less than that of the gas initially input into the inlet I1 of the upper passage Pup.

Gas flows of the first and second paths P1 and P2 through the gas passage P may fundamentally block particles that may be input around the sides of the EUV pellicle 110 and blocking film 120 from under the EUV pellicle 110 and the blocking film 120.

Although the EUV mask protection apparatus 100c according to the current embodiment has a structure in which the side cover 150 is added to the EUV mask protection apparatus 100 of FIG. 1, embodiments are not limited thereto. For example, the side cover 150 may be added to the EUV mask protection apparatus 100a of FIG. 6A or the EUV mask protection apparatus 100b of FIG. 8A.

Since the EUV mask protection apparatus 100c includes the EUV pellicle 110, which corresponds to a slit of an exposure apparatus and has a small size, the blocking film 120 disposed at both sides of the EUV pellicle 110, and the side cover 150 disposed to surround a side of the EUV pellicle 110 and a side of the blocking film 120, the EUV mask protection apparatus 100c may effectively block particles that may flow onto the EUV mask 200 during an exposure process, and thus may prevent the contamination of the EUV mask 200. Also, the EUV mask protection apparatus 100c may strengthen blocking of particles by gas passages for gas flow in the sides of the EUV pellicle 110 and blocking film 120, as well as under the EUV pellicle 110 and the blocking film 120, formed in the body 152 of the side cover 152.

Figure 10A:
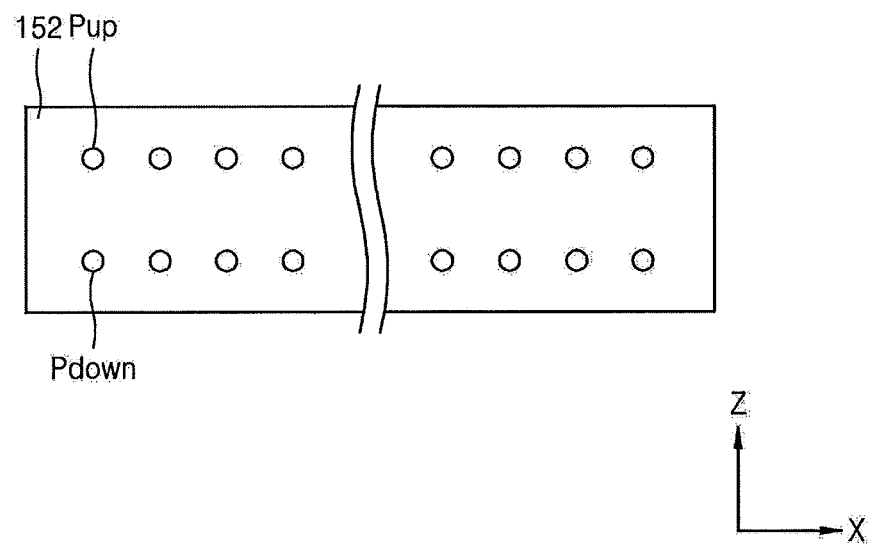
FIGS. 10A and 10B illustrate cross-sectional views along line V-V' of FIG. 9C.
Figure 10B:
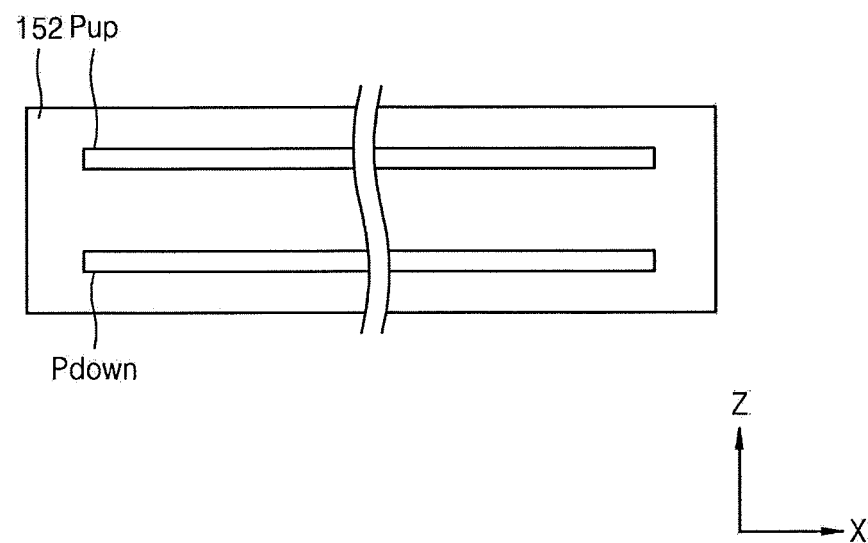

FIGS. 10A and 10B are cross-sectional views taken along the line V-V' of FIG. 9C. FIGS. 10A and 10B illustrate different examples of the gas passages.

For example, referring to FIG. 10A, a plurality of upper passages Pup and a plurality of lower passages Pdown may be formed in the first direction (X direction). Each of the plurality of upper passages Pup may have an outlet formed at the upper side of the groove H, and each of the plurality of lower passages Pdown may have an inlet formed at the lower side of the groove H. Each of the plurality of upper passages Pup and each of the plurality of lower passages Pdown may allow gas to flow through the first path P1 and the second path P2.

In another example, referring to FIG. 10B, an upper passage Pup and a lower passage Pdown each may be formed in the form of a line in the first direction (X direction). The upper passage Pup may have an outlet having a line form at the upper side of the groove H, and the lower passage Pdown may have an inlet having a line form at the lower side of the groove H. The upper passage Pup and the lower passage Pdown may allow gas to flow through the first path P1 and the second path P2.

Figure 11:
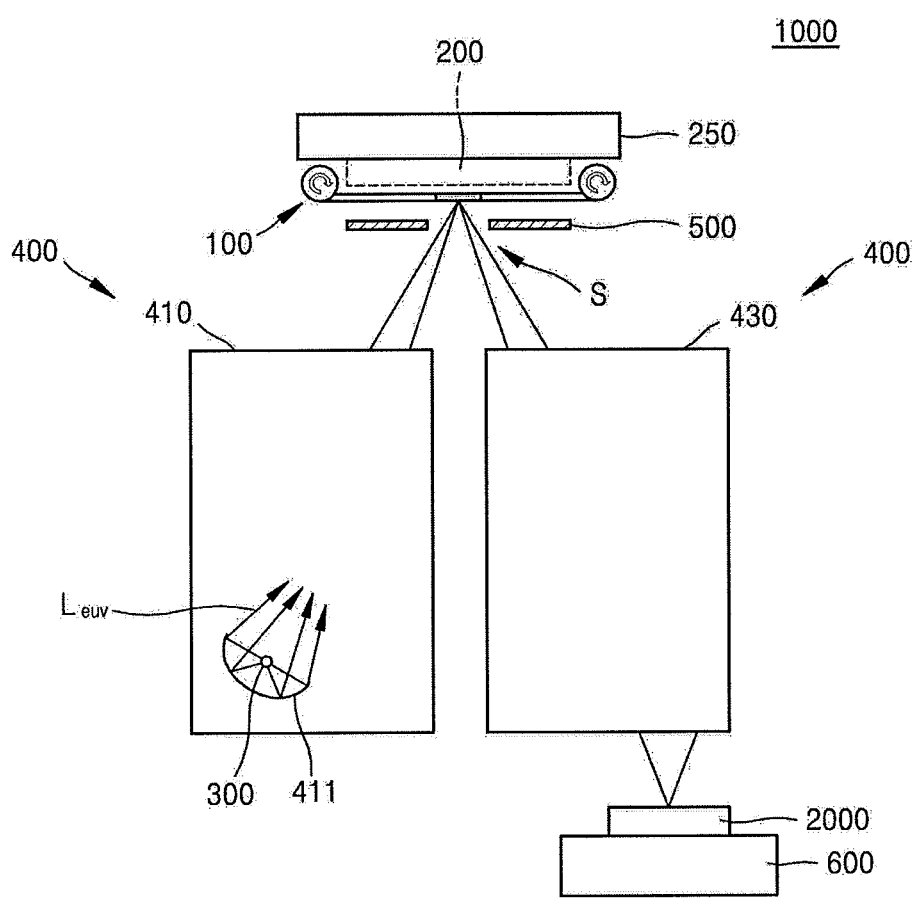
FIG. 11 illustrates a schematic configuration diagram of an EUV exposure apparatus including an EUV mask protection apparatus according to an embodiment.

FIG. 11 is a schematic configuration diagram of an EUV exposure apparatus 1000 including an EUV mask protection apparatus according to an embodiment. For convenience of explanation, descriptions provided above with reference to FIGS. 1 through 10B will be briefly stated or omitted.

Referring to FIG. 11, the EUV exposure apparatus 1000 according to the current embodiment may include the EUV mask protection apparatus 100, the EUV mask 200, an EUV light source 300, an optical system 400, a slit unit 500, and a wafer stage 600.

The EUV mask protection apparatus 100 may be the EUV mask protection apparatus 100 illustrated in FIGS. 1 through 2B. In addition, the EUV mask protection apparatus 100 may also be any one of the EUV mask protection apparatuses 100a, 100b, and 100c illustrated in FIGS. 6A, 8A, and 9A. The EUV mask 200 may be disposed on a mask stage 250. As a lower surface of the EUV mask 200 is surrounded by the EUV mask protection apparatus 100, or a lower surface and a side of the EUV mask 200 are surrounded by the EUV mask protection apparatus 100, particles that may be input under the EUV mask protection apparatus 100 during an exposure process may be blocked.

The EUV light source 300 may generate light within an EUV range, i.e., light having a wavelength of about 100 nm or less. The wavelength of the light generated by the EUV light source 300 may be adjusted to an operation wavelength of a projection system 430, e.g., about 13.5 nm or about 7 nm. A plasma source or a synchrotron light source may be used as the EUV light source 300.

The optical system 400 may transmit EUV generated from the EUV light source 300 to the EUV mask 200 and radiate light reflected from the EUV mask 200 to a wafer 2000. The optical system 400 may include an illumination system 410 and the projection system 430.

The lighting system 410 may include a plurality of illumination mirrors and radiate EUV generated from the EUV light source 300 to the EUV mask 200. The structure of the illumination system 410 including a plurality of illumination mirrors is well known. Thus, for convenience of description, only a first illumination mirror 411, which collects EUV generated from the EUV light source 300 and provides the collected EUV to another illumination mirror, is illustrated in FIG. 11 and other illumination mirrors are not illustrated in FIG. 11.

The projection system 430 may radiate EUV reflective light reflected from the EUV mask 200 to the wafer 2000. The projection system 430 may include a plurality of imaging mirrors, and the structure of the projection system 430 is well known. Thus, for convenience of description, the plurality of imaging mirrors are not illustrated in FIG. 11 and only the projection system 430 is simply illustrated as a rectangular block in FIG. 11.

The slit unit 500 may include a slit S that transmits EUV and limits the EUV to a portion of the EUV mask 200. As the mask stage 250 moves in an opposite direction to a scan direction during a scanning process, the EUV may be radiated onto the portion of the EUV mask 200 through the slit S. The EUV pellicle 110 (refer to FIG. 1) of the EUV mask protection apparatus 100 may move in the scan direction together with the slit S, while being synchronized with the position of the slit S in the scanning process, as described above. When the EUV mask 200 moves in the opposite direction, the EUV pellicle 110 may maintain the same position as the slit S by unwinding and winding of rollers (not shown).

The wafer 2000 may be disposed on and supported by the wafer stage 600. The wafer stage 600 may move in at least one of the X direction, the Y direction, and the Z direction.

Since the exposure apparatus 1000 according to the current embodiment includes the EUV mask protection apparatus 100, the exposure apparatus 1000 may block particles that may flow onto the EUV mask 200 during an exposure process, and thus may prevent the contamination of the EUV mask 200. In addition, since the EUV pellicle 110 of the EUV mask protection apparatus 100 moves while being synchronized with a scan position, the EUV mask protection apparatus 100 may not have an influence on an exposure process. Accordingly, the exposure apparatus 1000 according to the current embodiment may stably perform an exposure process, improve the quality of patterns on wafers, and extend the life of the EUV mask 200.

By way of summation and review, a mask may be contaminated by particles during an exposure process. Accordingly, a mask surface is generally protected by using a transparent pellicle. The transparent pellicle is separated from the mask surface by a predetermined distance. Since the surface of the pellicle deviates from a focal position in an optical path, particles on the surface of the pellicle are not transferred to a wafer. However, due to the high absorption characteristics of EUV light, a pellicle having a thickness of several hundred nm or more, which is used in a DUV exposure process, cannot be used in an EUV exposure process. Further, it is difficult to use a thin pellicle since the pellicle may be unstable and easily damaged.

In contrast, according to embodiments, an EUV exposure apparatus may include a pellicle having a small size, i.e., that is sufficient to overlap and cover a scanning slit therein, that is connected to a sturdy flexible film. As such, the size of the pellicle that is fragile is reduced. In addition, a roller is installed so that the pellicle may move along a scan position, and the position of the pellicle is synchronized with the scan position, and thus, an exposure process is not influenced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An apparatus for protecting an extreme ultra violet (EUV) mask, the apparatus comprising:
    an EUV pellicle that allows EUV light to be radiated through the EUV pellicle onto the EUV mask, the EUV pellicle having a size corresponding to a size of a slit limiting the EUV light to a predetermined portion of the EUV mask;
    a flexible blocking film at opposite sides of the EUV pellicle in a first direction, the first direction being a scan direction of an exposure apparatus; and
    a roller unit including a first roller and a second roller, a first portion of the flexible blocking film being wound around the first roller at a first side of the EUV pellicle, and a second portion of the flexible blocking film being wound around the second roller at a second side of the EUV pellicle.

2. The apparatus as claimed in claim 1, wherein the EUV pellicle is movable in the first direction while being synchronized with a scan position of the exposure apparatus, the EUV pellicle being movable via unwinding and winding of the first and second rollers.

3. The apparatus as claimed in claim 1, wherein the EUV pellicle has a size that is greater than that of a horizontal section of EUV light input through the slit.

4. The apparatus as claimed in claim 3, wherein a length of the EUV pellicle in a second direction that is perpendicular to the first direction is equal to or greater than that of the EUV mask in the second direction.

5. The apparatus as claimed in claim 3, wherein a length of the EUV pellicle in a second direction that is perpendicular to the first direction is smaller than that of the EUV mask in the second direction, the blocking film being at opposite sides of the EUV pellicle in the second direction.

6. The apparatus as claimed in claim 5, wherein the length of the EUV pellicle in the second direction corresponds to a length of an effective pattern region of the EUV mask in the second direction.

7. The apparatus as claimed in claim 1, wherein the EUV pellicle includes a material and a thickness having transmittance of about 85% or more with respect to the EUV light.

8. The apparatus as claimed in claim 1, wherein the EUV pellicle includes silicon and has a thickness of about 80 nm or less, and the blocking film has a thickness of about 100 nm or more.

9. The apparatus as claimed in claim 1, further comprising a side cover surrounding opposite sides of the EUV pellicle and opposite sides of the blocking film in a second direction that is perpendicular to the first direction.

10. The apparatus as claimed in claim 9, wherein the side cover includes:
    a body and a fence extending from an upper surface of the body in an upper direction, and
    a line-shaped groove in a side of the body in the first direction, the EUV pellicle and the blocking film being inserted in the groove.

11. The apparatus as claimed in claim 10, further comprising a gas passage for gas flow in the body, the gas passage including:
    an upper passage in an upper portion of the body, the upper passage having an outlet at an upper side of the groove; and a lower passage in a lower portion of the body, the lower passage having an inlet at a lower side of the groove, wherein a portion of gas input to the upper passage flows to the lower passage via the outlet, sides of the EUV pellicle and blocking film inserted in the groove, and the inlet, and a remaining portion of the gas flows to lower sides of the EUV pellicle and blocking film via the outlet and the sides of the EUV pellicle and blocking film.

12. An extreme ultra violet (EUV) exposure apparatus, comprising:

an EUV light source;

an EUV mask having a pattern to be transferred onto a wafer;

an optical system that transmits EUV light generated from the EUV light source to the EUV mask, and transmits the EUV light reflected from the EUV mask to the wafer;

a slit unit under the EUV mask, the slit unit having a slit that limits the EUV light to a predetermined portion of the EUV mask;

an EUV mask protection apparatus including:

an EUV pellicle between the EUV mask and the slit unit to transmit the EUV light, the EUV pellicle having a size corresponding to a size of the slit, and flexible blocking film at opposite sides of the EUV pellicle in a first direction that is a scan direction of the EUV exposure apparatus; and a wafer stage supporting the wafer.

13. The EUV exposure apparatus as claimed in claim 12, wherein the EUV mask protection apparatus further comprises a roller unit including a first roller and a second roller, a first portion of the flexible blocking film being wound around the first roller at a first side of the EUV pellicle, and a second portion of the flexible blocking film being wound around the second roller at a second side of the EUV pellicle.

14. The EUV exposure apparatus as claimed in claim 13, wherein the EUV pellicle is movable in the first direction while being synchronized with a scan position of the exposure apparatus, the EUV pellicle being movable via unwinding and winding of the first and second rollers.

15. The EUV exposure apparatus as claimed in claim 12, wherein the EUV mask protection apparatus further comprises a side cover surrounding opposite sides of the EUV pellicle and opposite sides of the blocking film in a second direction that is perpendicular to the first direction.

16. The EUV exposure apparatus as claimed in claim 12, wherein a width of the EUV pellicle along the first direction equals a maximal width of the slit along the first direction.

17. An apparatus for protecting an extreme ultra violet (EUV) mask, the apparatus comprising:

an EUV pellicle having a width smaller than a width of the EUV mask;

a flexible blocking film connected to opposite sides of the EUV pellicle in a first direction, the first direction being a scan direction of an exposure apparatus; and a roller unit including a first roller and a second roller, a first portion of the flexible blocking film being wound around the first roller at a first side of the EUV pellicle, and a second portion of the flexible blocking film being wound around the second roller at a second side of the EUV pellicle.

18. The apparatus as claimed in claim 17, wherein a sum of the width of the EUV pellicle and widths of the flexible blocking film in the first direction equals the width of the EUV mask in the first direction.

19. The apparatus as claimed in claim 18, wherein the EUV pellicle is stretched between the first and second portions of the flexible blocking film along the first direction, EUV light being transmitted only through the stretched EUV pellicle at about 85% or more.

20. The apparatus as claimed in claim 17, wherein a thickness of the EUV pellicle along a direction normal to the EUV mask is smaller than a thickness of the flexible blocking film along the direction normal to the EUV mask.

* * * * *